United States Patent [19]

Dansky et al.

[11] Patent Number: 4,605,870
[45] Date of Patent: Aug. 12, 1986

[54] HIGH SPEED LOW POWER CURRENT CONTROLLED GATE CIRCUIT

[75] Inventors: Allan H. Dansky, Poughkeepsie; John P. Norsworthy, Fishkill, both of N.Y.

[73] Assignee: IBM Corporation, Hopewell Junction, N.Y.

[21] Appl. No.: 478,613

[22] Filed: Mar. 25, 1983

[51] Int. Cl.[4] .................. H03K 3/33; H03K 17/04; H03K 19/013; H03K 19/088
[52] U.S. Cl. ................... 307/443; 307/456; 307/300; 307/280
[58] Field of Search ............... 307/454, 455, 456, 443, 307/467, 475, 457, 458, 270, 280, 300, 319, 320

[56] References Cited

U.S. PATENT DOCUMENTS

| | | | |
|---|---|---|---|
| 2,964,652 | 12/1960 | Yourke | 307/88.5 |
| 3,505,535 | 4/1970 | Cavaliere | 307/203 |
| 3,614,467 | 10/1971 | Tu | 307/300 X |
| 3,676,708 | 7/1972 | Uchida | 307/319 X |
| 3,909,637 | 9/1975 | Dorler | 307/455 X |
| 4,092,551 | 5/1978 | Howard et al. | 307/254 |
| 4,132,906 | 1/1979 | Allen | 307/443 |
| 4,306,159 | 12/1981 | Wiedmann | 307/457 |
| 4,321,485 | 3/1982 | Morozowich et al. | 307/300 |
| 4,330,723 | 5/1982 | Griffith | 307/458 X |
| 4,453,089 | 6/1984 | Shuey et al. | 307/280 X |

OTHER PUBLICATIONS

IBM Technical Disclosure Bulletin, Dansky et al., Current-Controlled Gate Push-Pull Dotting, Nov. 1981, pp. 3031-3034.
IBM Technical Disclosure Bulletin, Barish et al., Current Switch Push-Pull Internal Circuit, Nov. 1981, p. 3041.

Primary Examiner—Stanley D. Miller
Assistant Examiner—David R. Bertelson
Attorney, Agent, or Firm—John F. Ohlandt

[57] ABSTRACT

The invention pertains to semiconductor circuitry, and more particularly to a class of circuitry known as current controlled gate circuits for driving very large scale integrated circuit gate arrays; the novel circuit can achieve much lower speed-power products than other circuitry, such as the well known $T^2L$ circuitry; the circuit includes push-pull drive and it provides negligible DC current in both DC states, that is, On and Off.

8 Claims, 3 Drawing Figures

HIGH SPEED LOW POWER CURRENT CONTROLLED GATE CIRCUIT

BACKGROUND OF THE INVENTION

1. Field of the Invention

This invention pertains to semiconductor digital circuits, and more particularly, to a branch or field thereof known as current controlled gates, which are bipolar logic circuits intended for use on dense, very large scale integrated circuit gate arrays. In this particular field of current controlled gate circuits, the emphasis is upon extending the art to ever greater densities and to the achievement of lower propagation delays.

2. Background Information

In order to provide background information so that the invention may be completely understood and appreciated in its proper context, reference may be made to a number of prior art patents and publications as follows: U.S. Pat. Nos. 2,964,652; 3,505,535; and 4,092,551; all of which are assigned to the assignee of the present invention; Article in IBM Technical Disclosure Bulletin Vol. 24 No. 6, pages 3031-3034, November 1981, entitled "Current Controlled Gate Push-Pull Dotting"; U.S. patent application Ser. No. 221,684 filed Dec. 30, 1980, and assigned to the assignee of the present invention.

U.S. Pat. No. 3,505,535 to Cavaliere in particular discloses an improvement on what has come to be known in the art as the "current switch", a form of circuitry first disclosed in U.S. Pat. No. 2,964,652 to H. S. Yourke. In the current switch a constant current is switched either to one or more logic input transistors, or to a grounded-base transistor, depending upon potential levels of the logic signals at the bases of the input transistors in relation to the reference potential at the grounded base transistor. Because the current which flows through the collector load resistors is constant and predetermined, circuit parameters may be selected so as to limit the potential swing of the collectors, thereby to maintain the transistors out of saturation. Nevertheless, despite the useful applications of the current switch, per se, U.S. Pat. No. 3,505,535 provides an improved clamp for the basic circuit, thereby to insure that the transistors therein are prevented from going deeply into the saturation region. This is achieved by a non-linear load impedance network in the form of a transistor at the output of the logic input transistors.

U.S. Pat. No. 4,092,551 to Howard et al discloses a so-called "speed-up" circuit, which uses a base-collector junction as a capacitor in order to aid in discharging the base of a saturated transistor; however, the present invention distinguishes therefrom as will be made apparent in the later description.

The article cited which appeared in the IBM Technical Disclosure Bulletin for November 1981 discloses a current controlled gate circuit which includes a Schottky barrier diode, connected between the emitter of one output transistor and the collector of the other. However, that circuit is directed to solving the difficult problem associated with the "dotting" of push-pull outputs, and the form and function of the circuit is similar to U.S. patent application Ser. No. 221,684 cited above.

Another disclosure which furnishes background information is that above cited U.S. patent application Ser. No. 221,684 in the name of J. A. Dorler et al, which discloses a transient controlled current switch in several forms or embodiments. However, that circuit does not operate in the manner provided by the present invention.

Whatever the precise merits, features and advantages of the above cited references, none of them achieves or fulfills the purposes of the current controlled gate circuit of the present invention.

Accordingly, it is a principal object of the present invention to achieve very low power dissipation in the operation of a current controlled gate circuit.

It is another principal object of the present invention to provide a circuit with characteristics that will enable the achievement of greater density in large scale gate arrays, as well as the achievement of lower propagation delays.

It should be noted that in the description of the circuit of the present invention it may appear that the topology is quite complex and, therefore, this might seem inconsistent with the circuit being used for a dense "master slice". However, density in gate arrays is actually limited by the space required to interconnect the gates and therefore, the space that the silicon devices occupy becomes irrelevant as long as they fit into a rectangle prescribed by the required wiring channels per gate in the two levels above the gate dedicated to interconnection metal.

In any event, it will be clear that to advance the art it is necessary that a logic circuit have minimal propagation delay. This propagation delay may be thought of as being composed of two parts: the unloaded delay, and the added delay due to loading (e.g. fan out, wiring capacitance, etc.). The delay per unit load is called the sensitivity due to loading (for example: 0.1 ns/pf or 0.3 ns/fo, where ns is nanoseconds, pf is picofarads and fo is fan out).

SUMMARY OF THE INVENTION

In fulfillment and implementation of the previously recited objects, a primary feature of the invention resides in the provision of a unique coupling arrangement for coupling the input section to a push-pull output section in the current controlled gate circuit. Included in this coupling arrangement is a transistor having its emitter-and-base short circuited so that that particular transistor serves as a collector-base diode with high capacitance when forward biased. As will be explained hereinafter, this enables keeping one of the output transistors—hereinafter referred to as the third or pull-down transistor—ON when the input is down and to capacitively couple the input so as transiently to overdrive that third transistor.

A more specific feature resides in the inclusion of a feedback means comprising a diode, preferably in the form of a low barrier Schottky diode, connected to the aforenoted "shorted" transistor and to the output of the circuit. Additionally, a base resistor which is variably connected in accordance with the several embodiments, serves to keep the third transistor OFF when the input is UP. This resistor also supplies a small current to forward bias the aforenoted base-collector diode of the shorted transistor.

It will, therefore, be appreciated that by virtue of the coupling arrangement provided, the output section of the controlled gate circuit is active only during an output transition, consuming negligible power in either of the two DC states of the circuit. Moreover, a low supply voltage of approximately 2.1 volts to ground is used.

Furthermore, since the input section is buffered from loading factors at the output by the push-pull output section, resistances can be made large without causing unacceptably long delays. By increasing the resistances involved, power is further conserved.

It will also be understood from the detailed description which follows that the circuit of the present invention exploits inherent device capacitances to accelerate the downgoing transition of the output voltage of the gate. In conjunction with the "pull-up" provided by the emitter follower (second transistor) of the push-pull output section, lower delays are realized.

Other and further objects, advantages and features of the present invention will be understood by reference to the following specification in conjunction with the annexed drawing, wherein like parts have been given like numbers.

DESCRIPTION OF PREFERRED EMBODIMENTS

Before proceeding with a detailed description of the present invention, it should be noted that a description of several embodiments of the invention has already appeared in the IBM Technical Disclosure Bulletin, Vol. 24, No. 11A, and pages 5613-5618, April 1982. Accordingly, that article is incorporated herein by reference. The voltage wave forms contained therein may be consulted for an appreciation of the operation of the circuitry to be described.

Figure 1A:
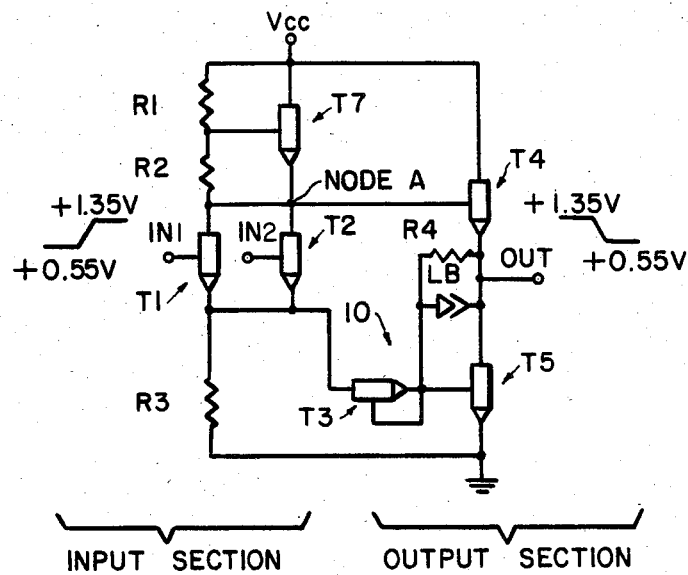
FIG. 1A is the most preferred embodiment of the current controlled gate circuit of the present invention.

Referring now specifically to FIG. 1A, there is illustrated the most preferred embodiment of the circuit inasmuch as it dissipates minimal power. It will be understood that although several input transistors, that is, T1 and T2, have been shown in the circuit to perform a NOR function, only a single transistor need be used in the input section for operation as an inverter. The input section also includes transistor T7 which functions as a clamp to prevent devices T1 and T2 from saturating at high temperature and high supply.

A voltage source Vcc is connected to both the input and output sections and a voltage divider, comprising R1 and R2, is provided for suitably biasing transistor T7. An output resistor R3 is connected in common to the emitters of transistors T1 and T2. Transistors T4 and T5 are included in the push-pull output section, the transistor T4 functioning basically as an emitter follower, while T5 functions as an AC coupled active pull-down device.

The unique coupling arrangement of the present invention is designated 10. This means for coupling extends from the emitter resistor R3 to the base input of transistor T5. The coupling means includes the transistor T3, which, as seen, has its emitter and base short circuited. Accordingly, this transistor functions as a base-to-collector diode which provides high capacitance when the input is initially Down. Furthermore, this capacitive element in the form of the base-to-collector diode enables capacitive coupling of the input signal to the base of transistor T5, thereby to drive T5 very hard ("overdrive") in the transient state, thereby giving a fast down-going transition at the output of the gate circuit.

As noted previously, the base resistor R4, seen in this particular embodiment to be connected from the output to the input of transistor T5, provides dc feedback to turn Off transistor T5 completely when the output of the circuit reaches a Down level. In this case, the current in T5 is in the microampere range. Resistor R4 also functions when the output is Up, to supply a small current to forward bias the base-collector diode of transistor T3. Consequently, R4 forms, with such base-collector diode, a biasing network to maintain the active pull down transistor T5 in a low current state, which is somewhat higher than the current state when the output is Down, but still is in the microampere range.

The low barrier Schottky diode LB is connected as a feedback means from the output of transistor T5 to its input, and gives an output voltage undershoot to about 0.5 volts, causing the Schottky diode LB to turn itself On, thereby turning Off transistor T5. The term "output voltage undershoot" refers to the fact that the downgoing wave or pulse dips further, for a brief period, than the level it obtains in its more permanent state. Thus, this device functions to provide dynamic feedback from the output of the circuit to the base of transistor T5 in order to reduce the high transient current in T5 to a low DC current when the output voltage state has switched and attahced a suitable Down level.

Operation

In describing the circuit operation, reference may be made to FIG. 1A in which the most preferred embodiment of the current controlled gate circuit is illustrated. The currents and voltages in the circuit are specified in accordance with the following:

IR3 . . . current in resistor R3
IB1 . . . base current in transistor T1
IE3 . . . emitter current in transistor T3
IE4 . . . emitter current in transistor T4
IC3 . . . collector current in transistor T3
VBE1 . . . base to emitter voltage of transistor T1
VBE2 . . . base to emitter voltage of transistor T2
VBC3 . . . base to collector voltage of transistor T3
VBE5 . . . base to emitter voltage of transistor T5
VA . . . voltage with respect to ground at node A
$V_{in}$ . . . input voltage of the gate circuit.

It will be understood that there are two DC states of the current controlled gate circuit, one being when all of the inputs are Down, and the other being when any of the inputs are Up. When the input IN1 is Up, for example, T1 conducts a current approximately equal to $(V_{in} - VBE1)/R3$. This current is also carried by the anti-saturation clamp network described in U.S. Pat. No. 3,505,535 previously cited. This network consists of R1, R2 and T7. As a consequence, node A drops to about 1.1 volts. At this point, transistors T3, T4, and T5 are all operating in an extremely low current region (about 0.6 to 10 microamperes). Transistors T4 and T5 are each marginally On, thereby resulting in an output level of about 1.1 v/2=0.55 v., as indicated on FIG. 1A. A trickle of current passes through R4 and into the base of T5, thereby producing the marginally On state of T5. The output level of about 0.55 volts, which corresponds to the input being at an Up level of approximately 1.35 volts, is the Down level of the output.

On the other hand, when the inputs of transistors T1 and T2 are Down, that is, about 0.55 volts as indicated on FIG. 1A, transistors T1 and T2 are Off and consequently, VA rises to about $V_{CC}$. Therefore, transistor T4 becomes conducting so that $V_{out} = V_{cc} - VBE4$, which is approximately equal to 1.35 volts. This voltage corresponds to the Up level of the circuit. IE4 flows through R4, across the base-collector junction of T3, through R3, into ground. Resistor R4 is made much larger than resistor R3 so that almost all of the voltage drop due to this current appears across resistor R4. The small voltage drop across R3 plus the collector-to-base junction of transistor T3 form a "current mirror" with transistor T5. Due to the small voltage drop across R3, T3 should be designed with a large base-to-collector area to keep the current in T5 within an order of magnitude of the current in the R4-T3 combination. This current in the base-collector junction of transistor T3 acts to increase the capacitance of that junction, which will be exploited during the Down-going transition of the output voltage.

As indicated previously, the push-pull output section of the circuit of FIG. 1A provides for active transition in both directions, thereby providing high speed. When the input IN1 falls, transistor T1 turns Off and VA rises to the power supply level $V_{cc}$. The output follows node A Up since transistor T4 acts as an emitter follower. The circuit then rests in the DC state with the input Down, and the output UP.

In the other active transition, that is, when the input rises, transistor T3 acts as a capacitor to connect the emitter of transistor T1 to the base of transistor T5. The base-collector junction of T3 had been forward biased and, due to the presence of resistor R4, was carrying a small amount of current immediately prior to switching, which means that a fairly large capacitance existed across that junction at that time This causes VBE5 to rise quickly, thereby turning ON transistor T5, thereby creating a low impedance between the output of the circuit and ground. Thus the output voltage falls quite quickly. At the same time, the current conducted in transistor T1 passes through the antisaturation clamping network, causing node A to drop to about 1.1 volts; consequently, emitter follower T4 is nearly turned Off. Diode LB is a low barrier Schottky diode. When the output falls to a point such that VBC5 is about 0.3 volts, diode LB starts to conduct and drains excess charge from T3 through the collector of transistor T5, thereby causing the circuit to stabilize.

Figure 1B:
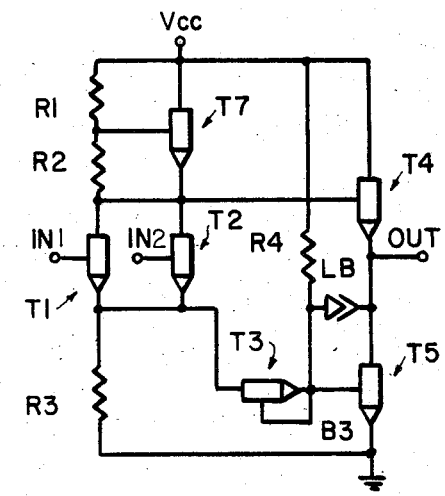
FIGS. 1B and 1C are schematic diagrams of alternate embodiments of the circuit of the present invention.

Although the circuit of FIG. 1A is considered the most preferred embodiment because it has been found to dissipate a minimum of power, other alternate embodiments are possible. In particular, these embodiments envision different connections for the resistor R4. Thus, as seen in FIG. 1B, instead of this resistor being connected from the emitter of T4 to the base of T5, it is connected between the base of T5 and the power supply $V_{cc}$, (thereby providing a current sink when driving a different type of load circuit from the one illustrated).

Figure 1C:
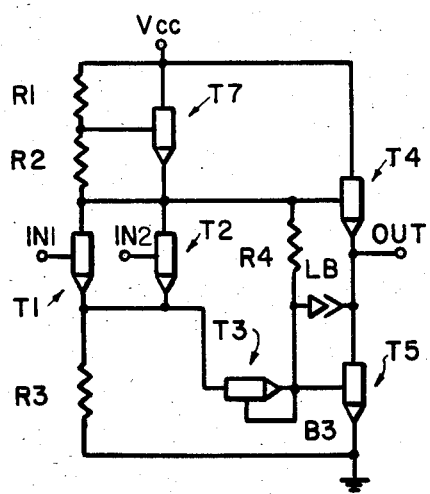

Another further embodiment of what is essentially the same circuit as seen in FIG. 1A involves the connection of R4 to the base of transistor T4, rather than to the emitter thereof as in FIG. 1A. FIG. 1C shows this embodiment, in which the resistor R4 can be made smaller than is the case in FIG. 1B.

To assist the man skilled in the art in the practice of the circuit of the present invention, a somewhat detailed specification is offered herewith:

All of the transistors for example in FIG. 1A, are NPN switching transistors; the resistor R3 has a value of approximately 1.0 kilohms, the resistor R4 has a value of 15 kilohms. The voltage $V_{cc}$ as indicated previously is 2.1 volts approximately. Accordingly, when the circuit of FIG. 1A with the values indicated is on the On state, such that at least one of the inputs has an Up value of 1.35 volts, (the output being Down), then a very small current flows through the push-pull output section; that is, through transistors T4 and T5, such current having a value of approximately 0.6 microamperes. The input current in the On condition is of the order of 500 to 1000 times greater than the output current value of 0.6 microamperes. Thus, it will be appreciated that, although the value of the output current may be varied in accordance with modifications of the circuit, the range of ratios of input to output current should be maintained in all cases.

The current controlled gate circuits in accordance with the present invention represent a means for achieving improved performance and lower power dissipation. The characteristic low sensitivity to capacitive loading makes it ideal for gate array applications, since delays can be well predicted before any circuits are automatically wired. If, for example, a logic gate in the critical path of a synchronous computing machine had excessive capacitive loading at its output after automatic placement of wiring, the desired machine cycle would not suffer greatly.

While there have been shown and described what are considered at present to be the preferred embodiments of the present invention, it will be appreciated by those skilled in the art that modifications of such embodiments may be made. It is therefore desired that the invention not be limited to these embodiments, and it is intended to cover in the appended claims all such modifications as fall within the true spirit and scope of the invention.

We claim:

1. A high speed, low power, current-controlled logic gate circuit comprising:
    a power supply;
    a first section including at least a first transistor having a logic input, which corresponds to the input of said gate circuit, and first and second outputs;
    a second, push-pull, section having an output, which corresponds to the output of said gate circuit, said second section further including at least interconnected second and third transistors; the second transistor having an input connected to the first output of said first section; the third transistor having an input;
    means for coupling the second output of said first section directly to the input of said third transistor, comprising means, including an asymmetrically conductive device and the inherent capacitance of said device, for overdriving and turning ON said third transistor during switching of said gate circuit from a state in which the output is at an UP level to a state in which the output is at a DOWN level;
    a resistor, connected to said asymmetrically conductive device so as to form with said device a biasing network for maintaining the third, or active pull-down, transistor in a low current ON state, which is in the microampere range, when the output of said gate circuit is at said UP level, said resistor also being operable at that time for supplying current to forward bias said asymmetrically conductive device, said resistor further providing DC feedback to turn OFF said third transistor when the output of said gate circuit reaches said Down level such that a very low current then flows through said third transistor, said very low current having a value of approximately 1 microampere, which is serveral times lower than said low current;

a Schottky diode connected as a dynamic feedback means from the output of said gate circuit to the input of said third transistor, said Schottky diode giving an output voltage undershoot, thereby turning itself ON and turning said third transistor OFF responsive to the output of said gate circuit switching to its DOWN level.

2. A circuit as defined in claim 1 in which said very low current at the output, when the output is Down, has a value of approximately 0.6 microamperes.

3. A circuit as defined in claim 1, in which the ratio between the input current and the output current, when the output is Down, is 500 to 1,000.

4. A circuit as defined in claim 1, in which said asymmetrically conductive device comprises a fourth transistor, said inherent capacitance being defined by the collector-base junction of said fourth transistor which has its base and emitter short circuited.

5. A circuit as defined in claim 4, in which said resistor is connected between the emitter of said fourth transistor and the emitter of said second transistor.

6. A circuit as defined in claim 4, in which said resistor is connected between the emitter of said fourth transistor and the base of said second transistor.

7. A circuit as defined in claim 4, in which said resistor is connected between the emitter of said fourth transistor and the power supply.

8. A circuit as defined in claim 4, further comprising an emitter resistor for said first transistor, the collector of said collector-base junction of said fourth transistor being connected to said emitter resistor, the base of said fourth transistor being connected to the base of said third transistor.

* * * * *